(12) United States Patent
Oda et al.

(10) Patent No.: US 7,242,038 B2
(45) Date of Patent: Jul. 10, 2007

(54) HETEROJUNCTION BIPOLAR TRANSISTOR

(75) Inventors: Yasuhiro Oda, Kanagawa (JP); Kenji Kurishima, Kanagawa (JP); Haruki Yokoyama, Kanagawa (JP); Takashi Kobayashi, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/560,756

(22) PCT Filed: Jun. 24, 2005

(86) PCT No.: PCT/JP2005/011606

§ 371 (c)(1),
(2), (4) Date: Dec. 13, 2005

(87) PCT Pub. No.: WO2006/003845

PCT Pub. Date: Jan. 12, 2006

(65) Prior Publication Data

US 2006/0231859 A1    Oct. 19, 2006

(30) Foreign Application Priority Data

Jul. 1, 2004  (JP)  ............................. 2004-195533
Sep. 13, 2004 (JP)  ............................. 2004-265753

(51) Int. Cl.
*H01L 29/739* (2006.01)
(52) U.S. Cl. .................................... 257/197; 257/198
(58) Field of Classification Search ................ 257/197, 257/198, 565, E29.033
See application file for complete search history.

(56) References Cited

U.S. PATENT DOCUMENTS 4,794,440 A * 12/1988 Capasso et al. ............. 257/191
4,821,082 A *  4/1989 Frank et al. ................. 257/198

FOREIGN PATENT DOCUMENTS

| JP | 2002-270615 A | 9/2002 |
| JP | 2002-270616 A | 9/2002 |
| JP | 2003-086602 A | 3/2004 |
| JP | 2004-214576 A | 7/2004 |
| JP | 2005-086135 A | 3/2005 |

OTHER PUBLICATIONS

M.W. Dvorak et al., "300 GHz InP/GaAsSb/InP Double HBTs with High Current Capability and BVceo≧6V", IEEE Electron Device Letters, vol. 22, No. 8, Aug. 2001, pp. 361.

F. Brunner et al., "Growth Monitoring of GaAsSb: C/InP Heterostructure with Reflectance Anisotropy Spectroscopy", TMS, Abstract of 12th ICMOVPE, 2004, pp. 2.

Oda et al., "Suppression of hydrogen passivation in carbon-doped GaAsSb grows by MOCVD", Elsevier, Journal of Crystal Growth, vol. 261, 2004, pp. 393.

* cited by examiner

*Primary Examiner*—Sara Crane
(74) *Attorney, Agent, or Firm*—Blakely Sokoloff Taylor & Zafman

(57) ABSTRACT

An n-type InP sub collector layer 2 heavily doped with silicon (Si), an InP collector layer 3, a p-type $GaAs_{(0.51)}Sb_{(0.49)}$ base layer 4 heavily doped with carbon (C), an n-type $In_{(1-y)}Al_{(y)}P$ emitter layer 7 doped with Si, an n-type InP cap layer 8 heavily doped with Si, and an n-type $In_{(0.53)}Ga_{(0.47)}As$ contact layer 9 heavily doped with Si are stacked on a substrate 1.

9 Claims, 6 Drawing Sheets

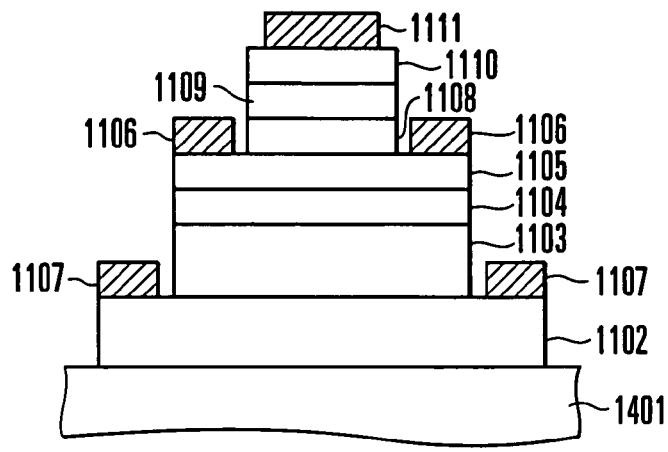
F I G. 11
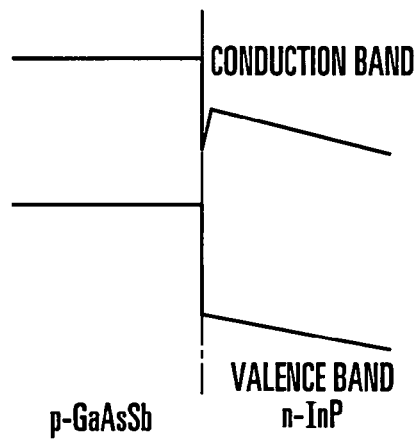
F I G. 12
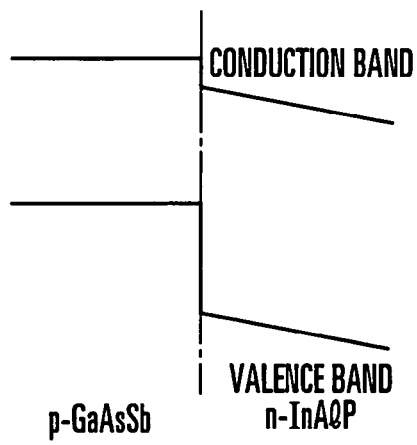
F I G. 13

HETEROJUNCTION BIPOLAR TRANSISTOR

The present patent application is a non-provisional application of International Application No. PCT/JP2005/011606, filed Jun. 24, 2005.

TECHNICAL FIELD

The present invention relates to a heterostructure bipolar transistor having a base made of GaAsSb.

BACKGROUND ART

GaAsSb is attracting attention as a compound semiconductor used as a base layer material of an InP-based heterostructure bipolar transistor (HBT). GaAsSb lattice-matches an InP substrate by a composition $GaAs_{(0.51)}Sb_{(0.49)}$. An $InP/GaAs_{(0.51)}Sb_{(0.49)}/InP$-based HBT using GaAsSb as a base can realize good high-frequency characteristics and high-breakdown-voltage characteristics at the same time (reference 1: "300 GHz InP/GaAsSb/InP Double HBTs with High Current Capability and BVceo≧6 V", M. W. Dvorak, Student Member, IEEE, C. R. Bolognesi, Member, IEEE, O. J. Pitts, and S. P. Watkins, Member, IEEE,: IEEE ELECTRON DEVICE LETTERS, VOL. 22, NO. 8, AUGUST 2001 p. 361). Heterostructures include a type-I heterostructure in which a conduction band $E_{CA}$ and valence band $E_{VA}$ of a semiconductor A and a conduction band $E_{CB}$ and valence band $E_{VB}$ of a semiconductor B have potentials (energy potentials) represented by "$E_{CA} > E_{CB}$" and "$E_{VA} > E_{VB}$" as shown in FIG. 14, and a type-II heterostructure in which "$E_{CA} < E_{CB}$" and "$E_{VA} < E_{VB}$" as shown in FIG. 15. The heterostructure bipolar transistor described above is made of the type-II heterostructure.

When $GaAs_{(0.51)}Sb_{(0.49)}$ is used as a base, the potential of this conduction band edge becomes higher than that of the conduction band edge of an InP collector layer, and this eliminates the current blocking effect in the collector which is a problem in an InGaAs/InP-based HBT. As described above, therefore, good high-frequency characteristics and high-breakdown-voltage characteristics can be obtained at the same time. In addition, when GaAsSb is applied to a base layer, carbon atoms having a small diffusion coefficient can be doped at a high concentration, and this is advantageous in reducing the base parasitic resistance.

Even when InGaAs is applied to a base layer, carbon atoms can be used as a p-type dopant, but ultrahigh-concentration doping at $5 \times 10^{19}$ cm$^{-3}$ or more is difficult. Also, it is pointed out that when an InGaAs layer is to be formed by metal organic chemical vapor deposition (MOCVD) as a general growth method, carbon acceptors are passivated by hydrogen atoms. This passivation of the carbon acceptors by hydrogen not only deteriorates the characteristics of a device by increasing the resistance of the base layer, but also causes a burn-in effect by which the resistance value fluctuates because the ratio of the carbon acceptors passivated by hydrogen changes while an electric current is applied, thereby deteriorating the reliability of the device as well. GaAsSb has a very high resistance against this hydrogen passivation.

DISCLOSURE OF INVENTION

Problems to be Solved by the Invention

Unfortunately, the InP/GaAsSb/InP-based HBT still has unsolved problems. One problem is the excess accumulation of emitter injection electrons caused by the discontinuity of the emitter/base conduction band edge, and the subsequent increase in emitter junction capacitance. In the conduction band edge of a heterostructure of an InP emitter layer and GaAsSb base layer, as shown in a band diagram of FIG. 16, the potential of a base layer made of p-type GaAsSb is higher than that of an emitter layer made of InP. This band discontinuity may cause excess electron accumulation in an emitter space-charge region. In addition, if a forward voltage is increased to supply a high electric current, a local potential drop occurs in the conduction band edge near the emitter/base interface, and this further increases the electron accumulation. Any of these problems functions as a capacitive component with respect to a device operation, and interferes with a high-speed operation of the device. These problems also increase a tunneling recombination current via a defect level near the emitter/base interface, thereby lowering the current gain.

To solve these problems, in an InP/GaAsSb-based HBT structure, it is necessary to decrease the emitter/base conduction band edge discontinuity (ΔEc), and reverse the relationship (the potential in the conduction band edge of the emitter>the potential in the conduction band edge of the base). As this method, the following two attempts have been made.

(1) Make the potential in the conduction band edge of the base layer lower than that of $GaAs_{(0.51)}Sb_{(0.49)}$.
(2) Use a material which makes the potential in the conduction band edge higher than that of InP as the emitter layer.

Method (1) described above can be realized by making the As content x of a $GaAs_{(x)}Sb_{(1-x)}$ base layer larger than 0.51 (e.g., reference 2: Japanese Patent Laid-Open No. 2002-270616). It is basically possible to easily realize this method only by changing the GaAsSb film formation conditions, but tensile strain occurs because the lattice constant of GaAsSb becomes smaller than that of InP. When the As content is increased, therefore, the critical film thickness (a film thickness exceeding the accumulation limit of the strain, which is obtained from, e.g., the degree of lattice mismatching between the substrate and grown layer, and the elastic coefficient of the grown layer material) of the GaAsSb layer decreases, and microcracks form in the GaAsSb layer if the critical film thickness is exceeded. This limits the increase in As content, and makes it impossible to well decrease ΔEc. Also, when a layered structure is to be formed by metal organic chemical vapor deposition (MOCVD), the increase in tensile strain described above poses the new problem that the hydrogen passivation resistance of carbon acceptors in carbon-doped GaAsSb largely decreases.

Method (2) above is to use $In_{(0.52)}Al_{(0.48)}As$ which lattice-matches InP (e.g., reference 3: Japanese Patent Laid-Open No. 2002-270615). In this material system, however, the Al content is as large as 0.48, so the resistance against native oxidation is much lower than that of InP. This material system also poses the problem that carriers are readily passivated by fluorine (F) in InAlAs doped with Si generally used as an n-type dopant, in addition to the problem that the n-type doping efficiency of an InAlAs layer is low. Furthermore, when a film containing a large amount of Al is to be formed by crystal growth, it is generally necessary to increase the growth temperature in order to obtain a film having high crystal quality (the temperature is generally 600° C. or more when crystal growth is performed by metal organic chemical vapor deposition). This increases the temperature difference from the growth temperature (about 500° C. under the same condition) of the base layer, thereby deteriorating the crystal quality of the base layer and base/collector interface. In addition, as also described in reference 2, a favorable InAlAs/GaAsSb interface is difficult to obtain.

The present invention has been made to solve the above problems, and has its object to allow a heterostructure bipolar transistor using GaAsSb as a base to suppress the current gain drop and increase the operating speed, by, e.g., reducing the capacitive component near the emitter/base interface while problems in the fabrication process such as passivation of an impurity and deterioration of the interface are suppressed.

Means for Solving the Problems

Basically, a heterostructure bipolar transistor according to the present invention has a heterostructure bipolar transistor structure having at least one layer made of a material containing In, Al, and P in an emitter layer, as a heterostructure bipolar transistor structure having a GaAsSb-based material as a base layer. The constituent devices of a compound semiconductor forming the base layer contain at least Ga, As, and Sb, and the constituent devices of a compound semiconductor forming the emitter layer contain at least In, Al, and P. As a consequence, the potential of the emitter layer can be raised at the interface between the emitter layer and base layer in the conduction band edge.

Also, a heterostructure bipolar transistor according to the present invention comprises at least a substrate made of InP, a collector layer formed on the substrate and made of a compound semiconductor containing indium and phosphorus, a base layer formed on the collector layer and made of a p-type compound semiconductor containing gallium, arsenic, and antimony, and an emitter layer formed on the base layer and made of an n-type compound semiconductor containing indium, aluminum, and phosphorus, wherein the composition ratio of indium to aluminum in the emitter layer is in a range within which the potential, in the conduction band edge on the base layer side, of the emitter layer is equal to or higher than that in the conduction band edge of the base layer.

In the above heterostructure bipolar transistor, at least one $GaAs_{(x)}Sb_{(1-x)}$ layer is used in the base layer, at least one $In_{(1-y)}Al_{(y)}P$ layer is used in the emitter layer, and x and y represent mixed crystal compositions and preferably fall within the ranges of $0<x<1$ and $0<y<1$, respectively. Also, the range of the composition x is preferably $0.2 \leq x \leq 0.8$, and the range of the composition y is preferably $0<y \leq 0.5$. The relationship between x and y is preferably $0.49x+1.554y \geq 0.25$. In addition, the ranges of the compositions x and y are preferably $0.45 \leq x \leq 0.55$ and $0<y \leq 0.25$, respectively, and the relationship between x and y is preferably $0.49x+1.554y \geq 0.36$.

In the above heterostructure bipolar transistor, the composition ratio of Al in the emitter layer may also be a graded composition, i.e., may also decrease away from the base layer. Likewise, the composition ratio of As in the base layer may also be a graded composition, i.e., may also decrease away from the base layer.

In the above heterostructure bipolar transistor, the collector layer may also be made of a compound semiconductor containing indium, aluminum, and phosphorus. In this case, the base layer is made of $GaAs_{(x)}Sb_{(1-x)}$, the collector layer is made of $In_{(1-z)}Al_{(z)}P$, and x and z represent mixed crystal compositions and preferably fall within the ranges of $0<x<1$ and $0<z<1$, respectively. Also, the range of the composition z is preferably $0<z \leq 0.18$, and the relationship between x and z is preferably $0.49x+1.554z \leq 0.36$. In addition, the composition ratio of Al in the collector layer may also be a graded composition, i.e., may also decrease away from the base layer.

Note that in the above heterostructure bipolar transistor, the individual layers are preferably formed by metal organic chemical vapor deposition, and carbon is preferably doped as a dopant to the base layer. Note also that if the base layer is formed at a growth temperature of 480° C. or more, the ratio of carbon acceptors passivated by hydrogen is decreased to 15% or less.

Effects of the Invention

In the present invention as explained above, in a heterostructure bipolar transistor having a GaAsSb-based material as a base layer, an emitter layer is made of a compound semiconductor containing indium, aluminum, and phosphorus, so the emitter/base $\Delta Ec$ can be reduced or reversed. This achieves a remarkable effect of allowing a heterostructure bipolar transistor using GaAsSb as a base to suppress the current gain drop and increase the operating speed, by, e.g., reducing the base-emitter capacitance and increasing the current gain, without decreasing the resistance of GaAsSb against hydrogen passivation and the reliability of a device.

BRIEF DESCRIPTION OF DRAWINGS

FIG. 11 is a sectional view showing an example of the arrangement of another heterostructure bipolar transistor according to an embodiment of the present invention;

FIG. 12 is a schematic view of the band lineup from a base layer to a collector layer when a boundary layer mainly containing InSb is formed at a GaAsSb/InP interface;

FIG. 13 is a schematic view of the band lineup from a base layer to a collector layer in the heterostructure bipolar transistor shown in FIG. 11;

BEST MODE FOR CARRYING OUT THE INVENTION

Embodiments of the present invention will be described below with reference to the accompanying drawings.

Figure 1:
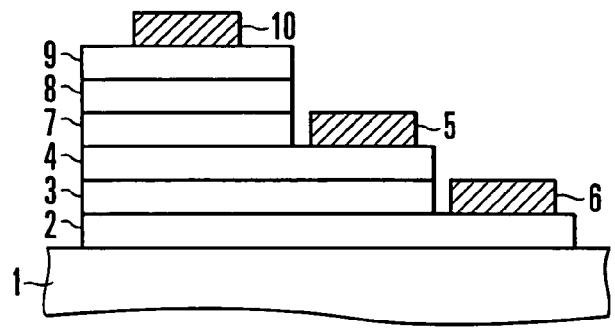
FIG. 1 is a schematic sectional view showing an example of the arrangement of a heterostructure bipolar transistor according to an embodiment of the present invention.

FIG. 1 is a schematic sectional view showing an example of the arrangement of a heterostructure bipolar transistor according to an embodiment of the present invention. In this heterostructure bipolar transistor shown in FIG. 1, an n-type InP sub collector layer 2 heavily doped with silicon (Si), an InP collector layer 3, a p-type $GaAs_{(0.51)}Sb_{(0.49)}$ base layer 4 heavily doped with carbon (C), an n-type $In_{(1-y)}Al_{(y)}P$ emitter layer 7 doped with Si, an n-type InP cap layer 8 heavily doped with Si, and an n-type $In_{(0.53)}Ga_{(0.47)}As$ contact layer 9 heavily doped with Si are stacked on an InP substrate 1 having a resistance increased by doping iron (Fe) as an impurity and having a (100) major surface.

In addition, an ohmic-contact collector electrode 6 is formed on a region of the sub collector layer 2 where the collector layer 3 is not formed, an ohmic-contact base electrode 5 is formed on a region of the base layer 4 where the emitter layer 7 is not formed, and an ohmic-contact emitter electrode 10 is formed on the contact layer 9.

The sub-collector layer 2 is doped with, e.g., Si at $2\times10^{19}$ cm$^{-3}$, the base layer 4 is doped with, e.g., C at $1.1\times10^{20}$ cm$^{-3}$, the emitter layer 7 is doped with, e.g., Si at $5\times10^{17}$ cm$^{-3}$, the cap layer 8 is doped with, e.g., Si at $2\times10^{19}$ cm$^{-3}$, and the contact layer 9 is doped with, e.g., Si at $3\times10^{19}$ cm$^{-3}$.

Note that details of the structure of the heterostructure bipolar transistor shown in FIG. 1 are omitted if nothing interferes with the explanation. Note also that the dopants and the constituent materials of the individual layers are not limited to those described above, and it is also possible to use other materials as long as a predetermined device operation can be realized. For example, Sn can be applied as an n-type dopant instead of Si, and Zn or Be can be applied as a p-type dopant instead of C (carbon).

An example of a method of fabricating the heterostructure bipolar transistor shown in FIG. 1 will now be briefly explained below. First, a structure in which the compound semiconductor layers described above are sequentially formed (stacked) on the substrate 1 is obtained by the well-known crystal growth technique (apparatus) such as MBE (Molecular Beam Epitaxy) or MOCVD (Metal Organic Chemical Vapor Deposition). Then, a mesa structure as shown in FIG. 1 is formed by the well-known lithography technique and etching technique. A mask pattern having holes in electrode formation portions is then formed by lithography, and Ti/Pt/Au is deposited on this mask pattern. After that, the mask pattern is removed (lifted off) to form a base electrode 5, collector electrode 6, and emitter electrode 10.

Figure 2:
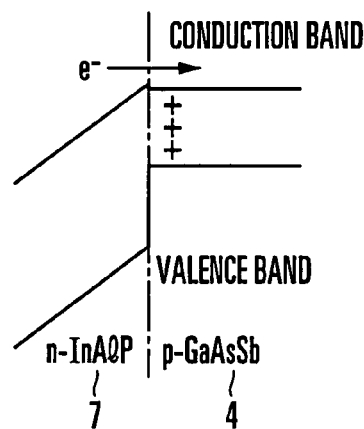
FIG. 2 is a diagram of the band lineup from an emitter layer 7 to a base layer 4.
Figure 16:
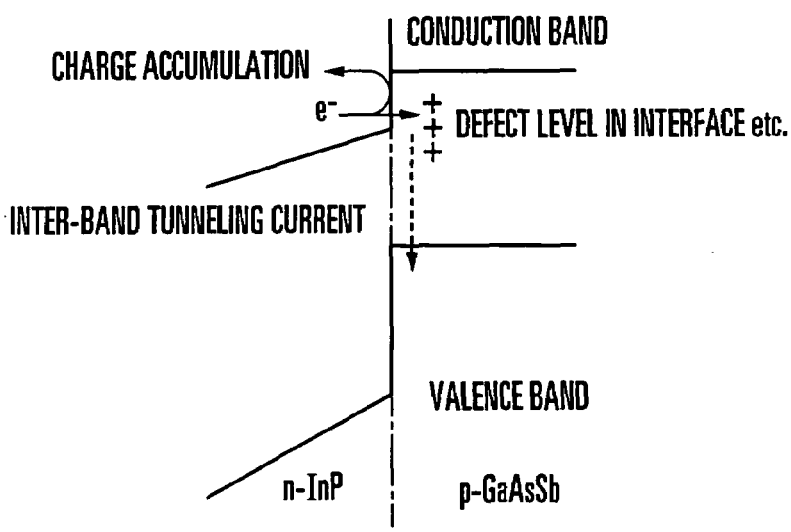
FIG. 16 is a schematic view of the band lineup in a heterostructure of an InP emitter layer and GaAsSb base layer.

In the heterostructure bipolar transistor shown in FIG. 1 formed as described above, the emitter layer 7 is made of $In_{(1-y)}Al_{(y)}P$ (y>0). Therefore, as shown in a band diagram of FIG. 2, in the conduction band edge, the emitter layer 7 has a higher potential than that of the base layer 4 at the interface between them. By contrast, in the band lineup near the emitter/base interface of the conventional InP/GaAsSb-based transistor, as shown in FIG. 16, the potential in the conduction band edge on the side of an InP emitter is lower than that on the side of a GaAsSb base.

In the heterostructure bipolar transistor shown in FIG. 1, this difference eliminates the barrier which exists near the emitter/base interface of the conventional device. As a consequence, in the heterostructure bipolar transistor shown in FIG. 1, electron accumulation near the emitter/base interface is suppressed, and this reduces the base-emitter capacitance. At the same time, the difference between the conduction band on the side of the emitter layer 7 and the valance band on the side of the base layer 4 increases, so the tunneling recombination current at the emitter/base interface reduces. As a result of these effects, the current gain of the heterostructure bipolar transistor shown in FIG. 1 becomes larger than that of the conventional device.

Figure 3:
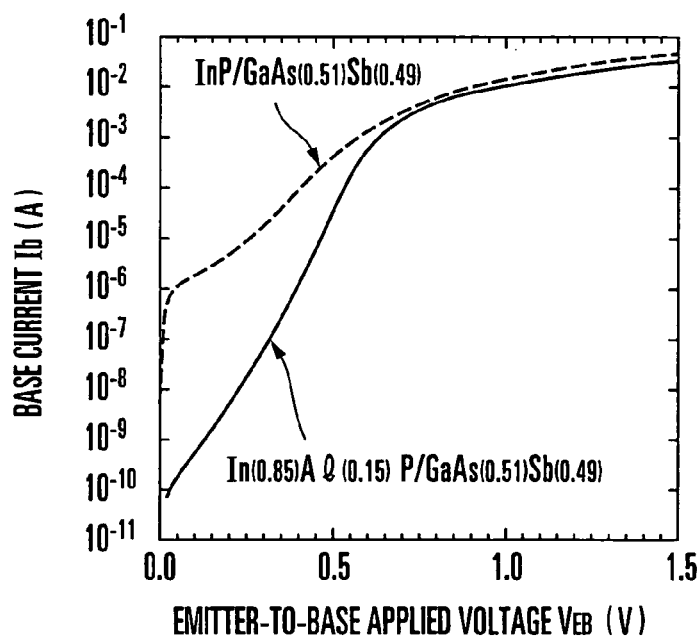
FIG. 3 is a graph which compares a base current $I_B$, as a gummel-plot, of a heterostructure bipolar transistor using an $In_{(0.85)}Al_{(0.15)}P$ emitter layer with that of a heterostructure bipolar transistor using an InP emitter layer.

As shown in FIG. 3, when compared to the dotted line indicating the conventional device in which the emitter is made of InP, the characteristic greatly improves as indicated by the solid line when the emitter layer is made of $In_{(0.85)}Al_{(0.15)}P$, although the Al content is low, 15%. Note that FIG. 3 compares a base current $I_B$, as a gummel-plot, of a heterostructure bipolar transistor using an emitter layer made of $In_{(0.85)}Al_{(0.15)}P$ with that of a heterostructure bipolar transistor using an emitter layer made of InP.

The composition of InAlP forming the emitter layer and that of GaAsSb forming the base layer will be explained below. In the following explanation, compositions by which the above-mentioned characteristics are obtained more effectively will be described from viewpoints indicated by (a), (b), (c), and (d) below.

(a) The relationship between the reduction in critical film thickness caused by shifting the composition from the point of lattice matching, and the film thickness required in respect of device characteristics.

(b) Combinations of compositions which reduce ΔEc.

(c) The relationship between the hydrogen passivation resistance of GaAsSb and the strain.

(d) The reduction in critical film thickness caused by the interaction between strained layers, and the generation of defects at the interface.

First, viewpoint (a) will be explained below. $GaAs_{(x)}Sb_{(1-x)}$ formed on an InP substrate undergoes tensile strain when $0.51 < x \leq 1$ and compression strain when $0 \leq x \leq 0.51$ due to mismatching of the lattice constants. Also, $In_{(1-y)}Al_{(y)}P$ undergoes tensile strain as long as y>0. It is generally impossible to make the film thickness of a strained layer larger than the critical film thickness. On the other hand, layers cannot be unlimitedly thinned for the reasons explained below. In the $GaAs_{(x)}Sb_{(1-x)}$ base layer, a doping concentration at which the crystal quality does not deteriorate is up to about $4\times10^{20}$ cm$^3$ in the case of carbon doping. Therefore, when the base resistance is decreased to increase the speed of a heterostructure bipolar transistor, e.g., when the base resistance is 600 Ω/□ (cm$^2$), the film thickness is about 15 nm.

Also, when the $In_{(1-y)}Al_{(y)}P$ emitter layer is thinned, its band bending becomes steep. Therefore, the conduction band of the $In_{(1-y)}Al_{(y)}P$ layer approaches the valence band edge of the GaAsSb base layer and the emitter/base interface, and the increase in tunneling recombination current becomes significant. Accordingly, it is also impossible to unlimitedly thin the $In_{(1-y)}Al_{(y)}P$ emitter layer. As described above, both the base layer made of $GaAs_{(x)}Sb_{(1-x)}$ and the emitter layer made of $In_{(1-y)}Al_{(y)}P$ must be so formed as to have a thickness which is equal to or smaller than the critical film thickness, and by which the device characteristics do not deteriorate. As conditions meeting this requirement, the ranges of the compositions x and y need only be $0.2 \leq x \leq 0.8$ and $0 < y \leq 0.5$, respectively.

Next, viewpoint (b) will be explained below. To obtain the effects of the present invention described previously, $\Delta Ec$ must be smaller than that in the case of $GaAs_{(0.51)}Sb_{(0.49)}/InP$. The differences between the potential of the conduction band of InP and those of $GaAs_{(x)}Sb_{(1-x)}$ and $In_{(1-y)}Al_{(y)}$ can be estimated by the compositions x and y. Since $\Delta Ec$ of $GaAs_{(0.51)}Sb_{(0.49)}/InP$ is estimated to be about 0.18 eV, the condition under which $\Delta Ec$ is 0.18 eV or less is $0.49x+1.554y \geq 0.25$ on the basis of the compositions x and y.

In addition to viewpoints (a) and (b) described above, to achieve the effects of the present invention, it is particularly desirable to use the condition $(0.49x+1.554y \geq 0.36)$ by which $\Delta Ec$ is close to 0 or the potential of the conduction band on the emitter layer side is higher. Under this condition, composition ranges having no adverse effect on a high-speed operation of a heterostructure bipolar transistor will be further examined below from viewpoints (c) and (d).

Viewpoint (c) will be explained first. If the As content x is $x \geq 0.51$, the $GaAs_{(x)}Sb_{(1-x)}$ layer undergoes tensile strain, and the hydrogen passivation resistance decreases. Hydrogen passivation is practically negligible when the ratio of hydrogen-passivated carbon acceptors to all carbon acceptors existing in the carbon-doped $GaAs_{(x)}Sb_{(1-x)}$ layer is approximately 5% or less. The allowable range of this condition is $x < 0.55$ as the composition of the $GaAs_{(x)}Sb_{(1-x)}$ layer. This is the upper limit of the composition of the $GaAs_{(x)}Sb_{(1-x)}$ layer in view of the hydrogen passivation resistance.

Next, viewpoint (d) will be explained. First, within the range of $0 \leq x < 0.51$, $\Delta Ec$ of $In_{(1-y)}Al_{(y)}P/GaAs_{(x)}Sb_{(1-x)}$ increases as x decreases because the potential of the conduction band of GaAsSb rises. This can be compensated for by increasing y. In this state, the interaction of the compression strain in the $GaAs_{(x)}Sb_{(1-x)}$ layer and the tensile strain in the $In_{(1-y)}Al_{(y)}P$ layer makes the critical film thickness smaller than that on the InP substrate, and increases the defect density at the emitter/base interface. These are the lower limit of the composition of the $GaAs_{(x)}Sb_{(1-x)}$ layer and the upper limit of the composition of the $In_{(1-y)}Al_{(y)}P$ layer in view of the interaction of the strained layers.

Figure 4:
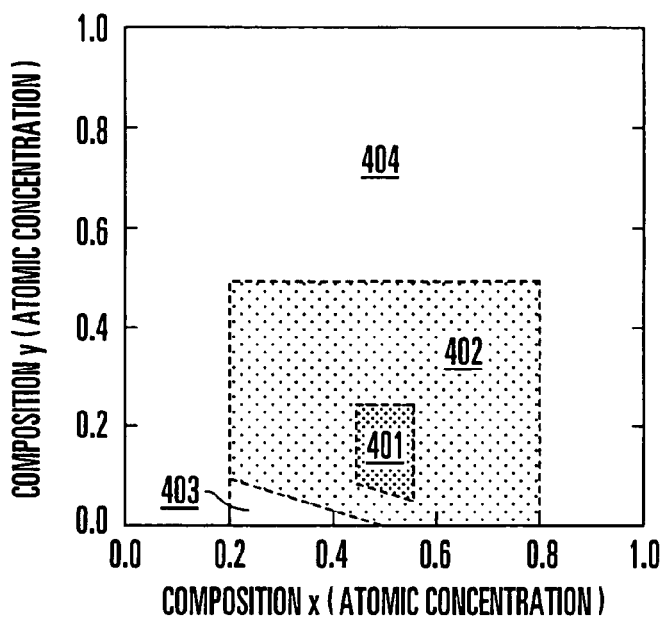
FIG. 4 is a graph for explaining the effective range of the invention obtained by compositions x and y in $In_{(1-y)}Al_{(y)}P/GaAs_{(x)}Sb_{(1-x)}$ of the present invention.

FIG. 4 collectively shows the conditions derived from viewpoints (a), (b), (c), and (d) described above. As shown in FIG. 4, a condition range indicated by a region 401 is a region where the effects of the present invention significantly appear. Also, a region 402 is a region where the effects of the present invention are obtained. A region 403 is a region where the emitter/base conduction band edge discontinuity ($\Delta Ec$) becomes larger than that when the emitter is made of InP. A region 404 is a region where no device (heterostructure bipolar transistor) having a practical film thickness can be designed because the strain of the formed film is strong.

As a method of further reducing the influence of strain and raising the potential of the conduction band on the emitter layer side, it is also possible to apply a compositionally-graded layer in which the Al content of the $In_{(1-y)}Al_{(y)}P$ emitter layer is decreased away from base-emitter junction (base layer side) to make InAlP approach InP.

On the other hand, the As content in the GaAsSb base layer may also be decreased away from the emitter layer side. In this case, the potential of the conduction band edge in the base layer lowers away from the emitter layer, and the internal electric field generated by this inclination accelerates the minority carriers in the base layer. This makes it possible to decrease the recombination probability of the minority carriers in the base layer, further increase the current gain, and also increase the operating speed of the device.

Figure 5A:
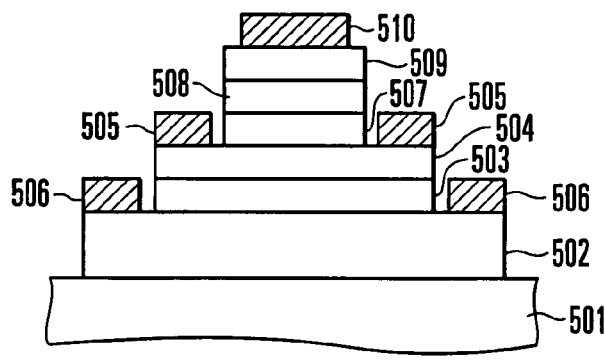
FIG. 5A is a sectional view showing an example of the arrangement of another heterostructure bipolar transistor according to an embodiment of the present invention.
Figure 5B:
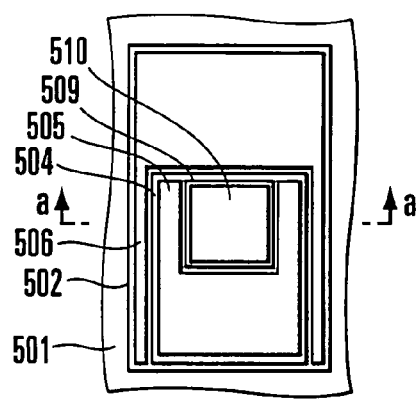
FIG. 5B is a plan view showing the example of the arrangement of the heterostructure bipolar transistor in FIG. 5A according to the embodiment of the present invention.

Another heterostructure bipolar transistor according to an embodiment of the present invention will be described below with reference to FIGS. 5A and 5B. FIG. 5A is a sectional view showing an example of the arrangement of the other heterostructure bipolar transistor according to the embodiment of the present invention, and FIG. 5B is a plan view. In this heterostructure bipolar transistor shown in FIGS. 5A and 5B, an n-type InP sub collector layer 502 heavily doped with silicon (Si), an InP collector layer 503, a p-type $GaAs_{(0.51)}Sb_{(0.49)}$ base layer 504 heavily doped with carbon (C), an n-type $In_{(0.85)}Al_{(0.15)}P$ emitter layer 507 doped with Si, an n-type InP cap layer 508 heavily doped with Si, and an n-type $In_{(0.53)}Ga_{(0.47)}As$ contact layer 509 heavily doped with Si are stacked on an InP substrate 501 having a resistance increased by doping iron (Fe) as an impurity and having a (100) major surface.

In addition, an ohmic-contact collector electrode 506 is formed on a region of the sub collector layer 502 where the collector layer 503 is not formed, an ohmic-contact base electrode 505 is formed on a region of the base layer 504 where the emitter layer 507 is not formed, and an ohmic-contact emitter electrode 510 is formed on the contact layer 509.

The sub-collector layer 502 is doped with, e.g., Si at $2 \times 10^{19}$ cm$^{-3}$, the base layer 504 is doped with, e.g., C at $1.1 \times 10^{20}$ cm$^{-3}$, the emitter layer 507 is doped with, e.g., Si at $5 \times 10^{17}$ cm$^{-3}$, the cap layer 508 is doped with, e.g., Si at $2 \times 10^{19}$ cm$^{-3}$, and the contact layer 509 is doped with, e.g., Si at $3 \times 10^{19}$ cm$^{-3}$. The film thicknesses of the collector layer 503, base layer 504, and emitter layer 507 are about 150, 20, and 30 nm, respectively.

Note that details of the structure of the heterostructure bipolar transistor shown in FIGS. 5A and 5B are omitted if nothing interferes with the explanation. Note also that the dopants and the constituent materials of the individual layers are not limited to those described above, and it is also possible to use other materials as long as a predetermined device operation can be realized.

An example of a method of fabricating the heterostructure bipolar transistor shown in FIGS. 5A and 5B will now be briefly explained below. First, a structure in which the compound semiconductor layers described above are sequentially formed (stacked) on the substrate 501 is obtained by the well-known crystal growth technique (apparatus) such as MBE or MOCVD. Especially when the layers from the base layer 504 are to be formed by MOCVD, the substrate temperature during film formation is desirably 480° C. or more in order to minimize the passivation of C acceptors by hydrogen. Note that the substrate temperature may also be lower than the above-mentioned value if the passivation of C acceptors in the base layer 504 is suppressed, e.g., if the layers from the base layer 504 are to be formed by MBE after the layers up to the collector layer 503 are formed by MOCVD.

Then, a mesa structure as shown in FIG. 5A is formed by the well-known lithography technique and etching technique. In the formation of this mesa structure, an etching stopper layer or the like may also be used to obtain higher selectivity during the etching process, as long as the spirit and scope of the invention hold.

A mask pattern having holes in electrode formation portions is then formed by lithography, and Ti/Pt/Au is deposited on this mask pattern. After that, the mask pattern is removed (lifted off) to form a base electrode 505, collector electrode 506, and emitter electrode 510. The stacked structures of these electrodes may also be made of other materials or may take different forms, provided that an ohmic contact with the underlying layer can be obtained in each electrode.

In the heterostructure bipolar transistor shown in FIGS. 5A and 5B formed as described above, the emitter layer 507 is made of InAlP. Therefore, as in the heterostructure bipolar transistor shown in FIG. 1 described above, in the conduction band edge, the emitter layer 507 has a higher potential than that of the base layer 504 at the interface between them. In the heterostructure bipolar transistor shown in FIGS. 5A and 5B, this eliminates the barrier which exists near the emitter/base interface of the conventional device.

As a consequence, in the heterostructure bipolar transistor shown in FIGS. 5A and 5B, electron accumulation near the emitter/base interface is suppressed, and this reduces the base-emitter capacitance. At the same time, the difference between the conduction band on the side of the emitter layer 507 and the valance band on the side of the base layer 504 increases, so the tunneling recombination current at the emitter/base interface reduces. As a result of these effects, the current gain increases in the heterostructure bipolar transistor shown in FIGS. 5A and 5B as well when compared to that of the conventional device.

Figure 6:
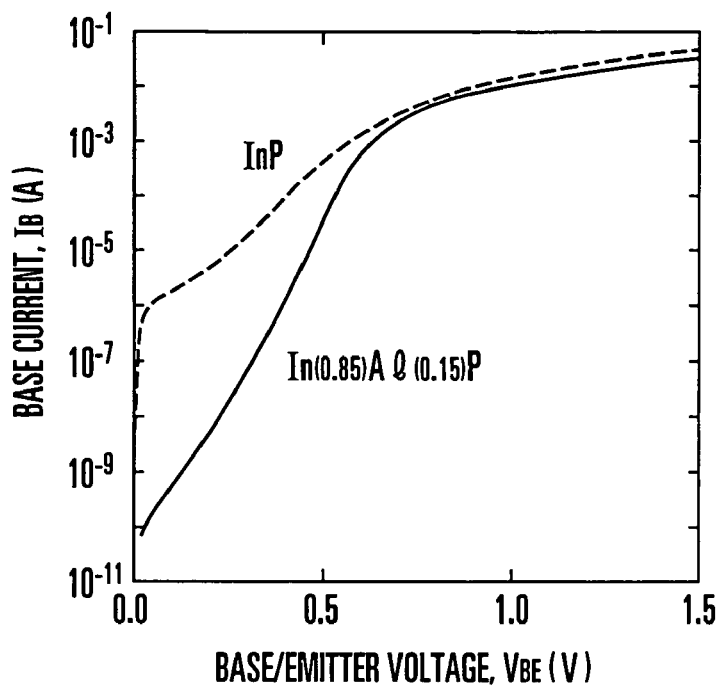
FIG. 6 is a graph which compares the gummel-plot of a heterostructure bipolar transistor using an emitter layer made of $In_{(0.85)}Al_{(0.15)}P$ with that of a heterostructure bipolar transistor using an emitter layer made of InP.

As shown in FIG. 6, when compared to the dotted line indicating the conventional device in which the emitter is made of InP, the characteristic greatly improves as indicated by the solid line when the emitter layer is made of InAlP, although the Al content is decreased to 15%. Note that FIG. 6 compares a base current $I_B$, as a gummel-plot, of a heterostructure bipolar transistor using an emitter layer made of $In_{(0.85)}Al_{(0.15)}P$ with that of a heterostructure bipolar transistor using an emitter layer made of InP.

Figure 7:
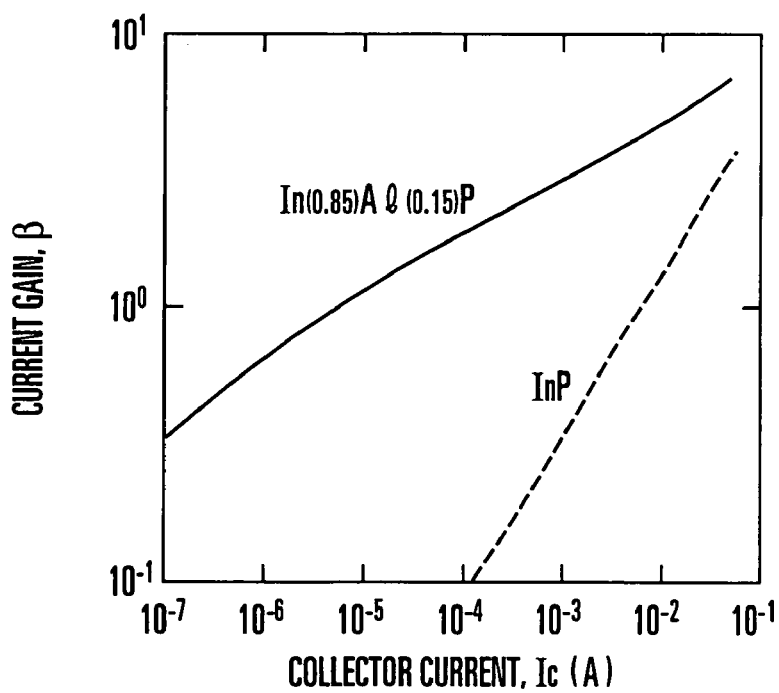
FIG. 7 is a graph showing the collector current $I_C$—current gain characteristics.

In addition, as shown in FIG. 7, in the heterostructure bipolar transistor shown in FIGS. 5A and 5B, the current gain characteristic improves as a whole and the characteristics of the heterostructure bipolar transistor greatly improve, when compared with the conventional device using InP as an emitter. Note that FIG. 7 shows the collector current $I_C$—current grain characteristics.

Figure 8:
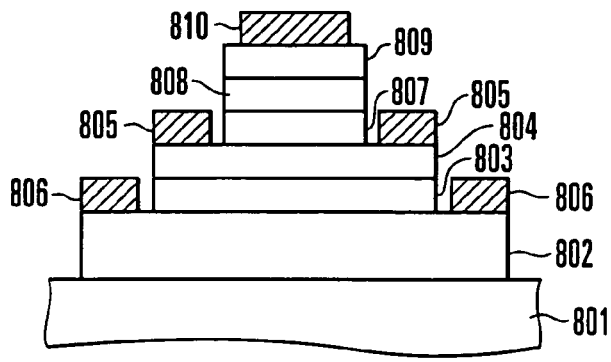
FIG. 8 is a sectional view showing an example of the arrangement of another heterostructure bipolar transistor according to an embodiment of the present invention.

Another heterostructure bipolar transistor according to an embodiment of the present invention will be described below with reference to FIG. 8. FIG. 8 is a sectional view showing an example of the arrangement of the heterostructure bipolar transistor according to the embodiment of the present invention. In this heterostructure bipolar transistor shown in FIG. 8, an n-type InP sub collector layer 802 heavily doped with silicon (Si), an InP collector layer 803, a p-type $GaAs_{(0.51)}Sb_{(0.49)}$ base layer 804 heavily doped with carbon (C), an n-type InAlP emitter layer 807, doped with Si, in which the compositions of In and Al change in the direction of thickness, an n-type InP cap layer 808 heavily doped with Si, and an n-type $In_{(0.53)}Ga_{(0.47)}As$ contact layer 809 heavily doped with Si are stacked on an InP substrate 801 having a resistance increased by doping iron (Fe) as an impurity and having a (100) major surface. The emitter layer 807 is in a graded composition state in which the In composition ratio changes from 0.75 to 1.00 and the Al composition ratio changes from 0.25 to 0, i.e., In increases and Al reduces, from the base layer 804 toward the cap layer 808.

In addition, an ohmic-contact collector electrode 806 is formed on a region of the sub collector layer 802 where the collector layer 803 is not formed, an ohmic-contact base electrode 805 is formed on a region of the base layer 804 where the emitter layer 807 is not formed, and an ohmic-contact emitter electrode 810 is formed on the contact layer 809.

The sub-collector layer 802 is doped with, e.g., Si at $2 \times 10^{19}$ cm$^{-3}$, the base layer 804 is doped with, e.g., C at $7 \times 10^{19}$ cm$^{-3}$, the emitter layer 807 is doped with, e.g., Si at $5 \times 10^{17}$ cm$^{-3}$, the cap layer 808 is doped with, e.g., Si at $1 \times 10^{19}$ cm$^{-3}$, and the contact layer 809 is doped with, e.g., Si at $1.5 \times 10^{19}$ cm$^{-3}$. The film thicknesses of the collector layer 803, base layer 804, and emitter layer 807 are about 180, 20, and 30 nm, respectively.

Note that details of the structure of the heterostructure bipolar transistor shown in FIG. 8 are omitted if nothing interferes with the explanation. Note also that the dopants and the constituent materials of the individual layers are not limited to those described above, and it is also possible to use other materials as long as a predetermined device operation can be realized. Furthermore, the heterostructure bipolar transistor shown in FIG. 8 can be fabricated in the same manner as the heterostructure bipolar transistors shown in FIG. 1 and FIGS. 5A and 5B described above.

In the heterostructure bipolar transistor shown in FIG. 8 formed as described above, the emitter layer 807 is made of InAlP. Therefore, as in the heterostructure bipolar transistor shown in FIG. 1 described above, in the conduction band edge, the emitter layer 807 has a higher potential than that of the base layer 804 at the interface between them. In the heterostructure bipolar transistor shown in FIG. 8, this eliminates the barrier which exists near the emitter/base interface of the conventional device.

As a consequence, in the heterostructure bipolar transistor shown in FIG. 8, electron accumulation near the emitter/base interface is suppressed, and this reduces the base-emitter capacitance. At the same time, the difference between the conduction band on the side of the emitter layer 807 and the valance band on the side of the base layer 804 increases, so the tunneling recombination current at the emitter/base interface reduces. As a result of these effects, the current gain increases in the heterostructure bipolar transistor shown in FIG. 8 as well when compared to that of the conventional device.

In addition, in the heterostructure bipolar transistor shown in FIG. 8, the emitter layer 807 has a graded composition, i.e., the Al composition ratio is high at the interface with the base layer 804 and lowers toward the cap layer 808. This alleviates the problem of strain caused by a high Al composition ratio.

Figure 9:
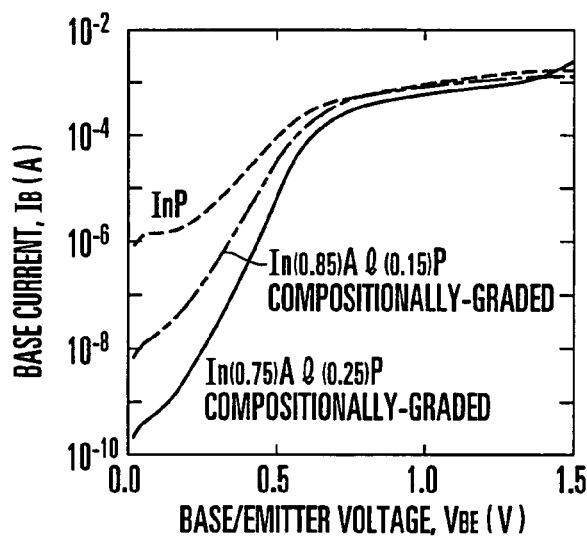
FIG. 9 is a graph which compares the gummel-plot of a heterostructure bipolar transistor using an emitter layer made of InAlP with that of a heterostructure bipolar transistor using an emitter layer made of InP.

As shown in FIG. 9, when compared to the dotted line indicating the conventional device in which the emitter is made of InP, the characteristic greatly improves as indicated by the solid line when the emitter layer is made of InAlP having the graded composition as described above. Also, as is apparent from comparison with an emitter layer (an alternate long and two short dashed line) which has a similar graded composition and in which the composition is $In_{(0.85)}Al_{(0.15)}As$ at the interface with a base layer, as the Al composition ratio in the emitter layer in a region near the base layer rises, the recombination current component in a low-voltage region reduces. Note that FIG. 9 compares a base current $I_B$, as a gummel-plot, of a heterostructure bipolar transistor using an emitter layer made of InAlP with that of a heterostructure bipolar transistor using an emitter layer made of InP.

Figure 10:
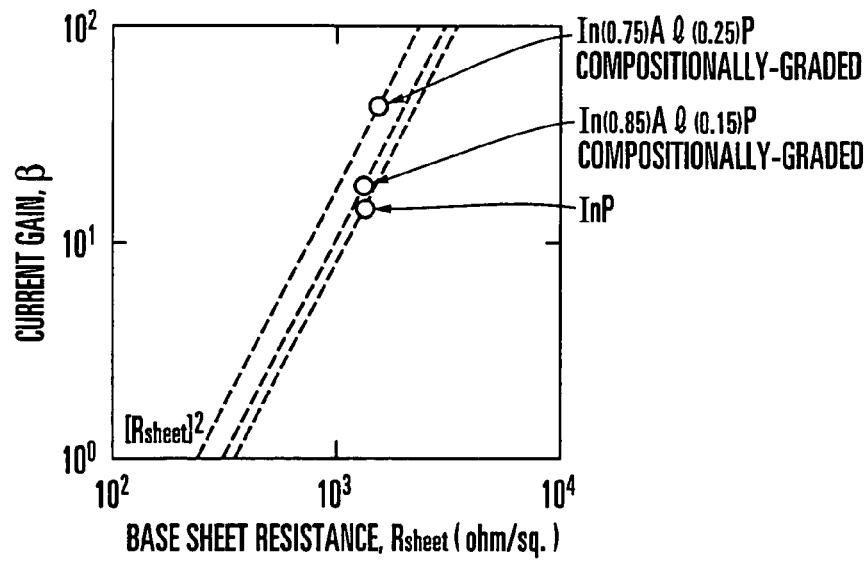
FIG. 10 is a graph showing the current gain characteristics of the heterostructure bipolar transistor shown in FIG. 8.
Figure 14:
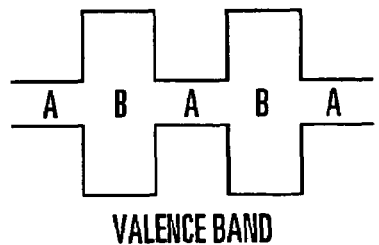
FIG. 14 is a schematic view of a type-I band lineup made of two types of semiconductors.
Figure 15:
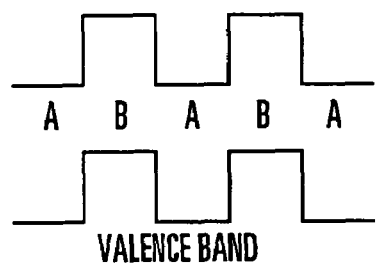
FIG. 15 is a schematic view of a type-II band lineup made of two types of semiconductors.

Furthermore, as shown in FIG. 10, in the heterostructure bipolar transistor shown in FIG. 8, the current gain characteristic improves as a whole and the characteristics of the heterostructure bipolar transistor greatly improve, when compared with the conventional device using InP as an emitter. Also, in the heterostructure bipolar transistor shown in FIG. 8, the current gain is higher than that when the Al composition ratio in the emitter layer in the region near the base layer is low. This is probably because the high Al composition ratio adds the effect of discharging electrons from the emitter to the base. As described above, when the emitter layer having the graded composition by which the Al composition ratio in the region near the base layer is high is used, a more notable current gain increasing effect can be obtained.

Another heterostructure bipolar transistor according to an embodiment of the present invention will be described below with reference to FIG. 11. FIG. 11 is a sectional view showing an example of the arrangement of the heterostructure bipolar transistor according to the embodiment of the present invention. In this heterostructure bipolar transistor shown in FIG. 11, an n-type InP sub collector layer 1102 heavily doped with silicon (Si), an InP collector layer 1103, an InAlP collector compositionally-graded layer 1104, a p-type $GaAs_{(0.51)}Sb_{(0.49)}$ base layer 1105 heavily doped with carbon (C), an n-type InAlP emitter layer 1108, doped with Si, in which the compositions of In and Al change in the direction of thickness, an n-type InP cap layer 1109 heavily doped with Si, and an n-type $In_{(0.53)}Ga_{(0.47)}As$ contact layer 1110 heavily doped with Si are stacked on an InP substrate 1101 having a resistance increased by doping iron (Fe) as an impurity and having a (100) major surface.

The collector compositionally-graded layer 1104 is in a graded composition state in which the In composition ratio changes from 1.00 to 0.92 and the Al composition ratio changes from 0 to 0.08, i.e., In reduces and Al increases, from collector layer 1103 toward the base layer 1105. Also, the emitter layer 1108 is in a graded composition state in which the In composition ratio changes from 0.75 to 1.00 and the Al composition ratio changes from 0.25 to 0, i.e., In increases and Al reduces, from the base layer 1105 toward the cap layer 1109.

In addition, an ohmic-contact collector electrode 1107 is formed on a region of the sub collector layer 1102 where the collector layer 1103 is not formed, an ohmic-contact base electrode 1106 is formed on a region of the base layer 1105 where the emitter layer 1108 is not formed, and an ohmic-contact emitter electrode 1111 is formed on the contact layer 1110.

The sub-collector layer 1102 is doped with, e.g., Si at $2\times10^{19}$ cm$^{-3}$, the base layer 1105 is doped with, e.g., C at $7\times10^{19}$ cm$^{-3}$, the emitter layer 1108 is doped with, e.g., Si at $5\times10^{17}$ cm$^{-3}$, the cap layer 1109 is doped with, e.g., Si at $1\times10^{19}$ cm$^{-3}$, and the contact layer 1110 is doped with, e.g., Si at $1.5\times10^{19}$ cm$^{-3}$. The film thicknesses of the collector layer 1103, collector compositionally-graded layer 1104, base layer 1105, and emitter layer 1108 are about 1110, 30, 20, and 30 nm, respectively.

Note that details of the structure of the heterostructure bipolar transistor shown in FIG. 11 are omitted if nothing interferes with the explanation. Note also that the dopants and the constituent materials of the individual layers are not limited to those described above, and it is also possible to use other materials as long as a predetermined device operation can be realized. Furthermore, the heterostructure bipolar transistor shown in FIG. 11 can be fabricated in the same manner as the heterostructure bipolar transistors shown in FIG. 1, FIGS. 5A and 5B, and FIG. 8 described above.

In the heterostructure bipolar transistor shown in FIG. 11 having the above arrangement, the emitter layer 1108 is made of InAlP. Therefore, as in the heterostructure bipolar transistors shown in FIGS. 1, 5A, and 8 described above, in the conduction band edge, the emitter layer 1108 has a higher potential than that of the base layer 1105 at the interface between them. In the heterostructure bipolar transistor shown in FIG. 8, this eliminates the barrier which exists near the emitter/base interface of the conventional device.

As a consequence, in the heterostructure bipolar transistor shown in FIG. 11, electron accumulation near the emitter/base interface is suppressed, and this reduces the base-emitter capacitance. At the same time, the difference between the conduction band on the side of the emitter layer 1108 and the valance band on the side of the base layer 1105 increases, so the tunneling recombination current at the emitter/base interface reduces. As a result of these effects, the current gain increases in the heterostructure bipolar transistor shown in FIG. 11 as well when compared to that of the conventional device.

Also, in the heterostructure bipolar transistor shown in FIG. 11, the emitter layer 1108 has a graded composition, i.e., the Al composition ratio is high at the interface with the base layer 1105 and lowers toward the cap layer 1109. This alleviates the problem of strain caused by a high Al composition ratio, so a higher current gain is obtained as in the heterostructure bipolar transistor shown in FIG. 8.

In addition, in the heterostructure bipolar transistor shown in FIG. 11, the composition of the collector in a region in contact with the base 1105 is InAlP. This makes it possible to solve the problem of a boundary layer at the collector/base interface to be explained below.

The melting points of compound semiconductors containing Sb are lower than those of compound semiconductors made only of P and As as other group-V atoms. Examples of compound semiconductors made of two devices are GaSb (712° C.) and InSb (524° C.) against GaP (1,467° C.), InP (1,060° C.), GaAs (1,240° C.), and InAs (942° C.). Also, a general growth temperature range of GaAsSb is 500° C. to 600° C. On the other hand, since the melting point of InSb is low, if InSb forms at the contact interface between InP and GaAsSb, the InP/GaAsSb interface temporarily becomes close to a liquid phase ("Growth Monitoring of GaAsSb: C/InP Heterostructure with Reflectance Anisotropy Spectroscopy", F. Brunner and three others, TMS, Abstract of 12th ICMOVPE, 2004, p. 2). In this state, the layers do not switch sharply, so a boundary layer in which the constituent devices of the two layers sandwiching the interface mix each other at random forms at the interface. If this boundary layer exists when each layer is to be selectively etched to form a device structure, the etching does not rapidly progress or abnormally progresses, and this makes it impossible to process the designed device shape.

Also, this layer generates transition defects by locally producing a strong strain, and locally increases or decreases the potential in the conduction band edge or valence band edge near the interface. For example, if a boundary layer mainly containing InSb forms at the GaAsSb/InP interface, a local drop occurs in the conduction band edge as shown in FIG. 12. Consequently, the recombination current increases via the defects to lower the current gain, and the drop or rise in the conduction band edge interferes with collector-to-base electron traveling, thereby deteriorating the device characteristics, e.g., decreasing the operating speed of the device.

To solve these problems, it is generally important to prevent the atomic diffusion from one layer to another (e.g., the diffusion of In from the InP layer to the GaAsSb layer, or the diffusion of Sb from the GaAsSb layer to the InP layer). In the case of the InP/GaAsSb-based transistor, however, potential In—Sb bonds inevitably form on the contact surface between InP and GaAsSb, so the problems cannot be completely solved only by suppressing the diffusion. It is also possible to make the growth temperature of the GaAsSb base layer lower than the melting point of InSb, thereby preventing the interface from changing into a liquid phase even when In—Sb bonds form on the contact surface between the collector layer made of InP and the base layer (GaAsSb).

In this case, however, low-temperature growth often deteriorates the crystal quality of the GaAsSb base layer. In addition, when a layered structure is to be fabricated by MOCVD, the hydrogen passivation resistance of carbon acceptors in carbon-doped GaAsSb largely decreases (reference "Suppression of hydrogen passivation in carbon-doped GaAsSb grows by MOCVD", Y. Oda and five others, ELSEVIER, Journal of Crystal Growth, 2004, Vol. 261, p. 393).

By contrast, the heterostructure bipolar transistor shown in FIG. 11 includes the InAlP collector compositionally-graded layer 1104 in a region where the base layer 1105 is to be formed, so that the base layer 1105 is formed on this InAlP layer. As a consequence, the formation of the boundary layer made of In and Sb can be suppressed. The suppression of the boundary layer will be explained in more detail below.

As described above, compound semiconductors containing Sb have low melting points, and compound semiconductors containing Al have high melting points. Examples are AlP (which sublimates at about 1,060° C.), AlAs (1,740° C.), and AlSb (1,080° C.). Also, the bonding energy of atoms increases in the order of Al—Sb>Ga—Sb>In—Sb, and is most stable in Al—Sb. Therefore, Al—Sb bonds form in preference to In—Sb bonds at the interface when a compound semiconductor containing aluminum is inserted at the interface between the collector layer and base layer, or when the collector layer is made of $In_{(1-z)}Al_{(z)}P$ (z>0). In this case, not InSb having a low melting point but InAlSb having a high melting point forms at the interface on the collector side of the base layer, and this makes it possible to prevent the interface from temporarily changing into a liquid phase in the initial stages of the growth of GaAsSb.

Since, however, compound semiconductors containing Al have not only high melting points but also high potentials in the conduction band edge, the potential in the conduction band edge of the collector layer becomes higher than that of the base layer if Al is thoughtlessly added. This state is a barrier to electrons traveling in the conduction band, thereby significantly decreasing the operating speed of the heterostructure bipolar transistor. This problem is also the reason of the difficulty of applying InAlAs to the collector layer although InAlAs which lattice-matches InP contains Al.

On the basis of the foregoing, compositions and the like by which the present invention is effectively applied will be explained below from viewpoints (i) to (iv) below:

(i) The relationship between the reduction in critical film thickness caused by shifting the composition from the point of lattice matching, and the film thickness required in respect of device characteristics.

(ii) The relationship between the hydrogen passivation resistance of GaAsSb and the strain.

(iii) The reduction in critical film thickness caused by the interaction between strained layers, and the generation of defects at the interface.

(iv) The relationship between compositions by which the potential in the conduction band edge is (collector layer<base layer).

First, viewpoint (i) will be explained below. $GaAs_{(x)}Sb_{(1-x)}$ formed on an InP substrate undergoes tensile strain when $0.51<x\leq1$ and compression strain when $0\leq x\leq0.51$ due to mismatching of the lattice constants. Also, $In_{(1-z)}Al_{(z)}P$ undergoes tensile strain as long as z>0. It is generally impossible to make the film thickness of a strained layer larger than the critical film thickness. On the other hand, layers cannot be unlimitedly thinned for the reasons explained below. In the $GaAs_{(x)}Sb_{(1-x)}$ base layer, a doping concentration at which the crystal quality does not deteriorate is up to about $4\times10^{20}$ $cm^3$ in the case of carbon doping. Therefore, when the base resistance is to be decreased to increase the speed of a heterostructure bipolar transistor, a film thickness of about 15 nm is necessary for, e.g., a base resistance of 600 $\Omega/\square$ ($cm^2$) and a doping concentration of $4\times10^{20}$ $cm^3$, and a film thickness of about 35 nm is necessary for a doping concentration of $8\times10^{19}$ $cm^3$. Therefore, a film having a film thickness which is equal to or smaller than the critical film thickness and does not deteriorate the device characteristics must be formed for both $GaAs_{(x)}Sb_{(1-x)}$ and $In_{(1-z)}Al_{(z)}P$. In particular, a practical range of x viewed from the critical film thickness is $0.2\leq x\leq0.8$ which takes account of the base resistance and the process margin resulting from fluctuation of the film thickness, and by which no criticality is reached even with a film thickness of 15 nm.

Next, viewpoint (ii) will be explained. If the As content x is $x\geq0.51$, the $GaAs_{(x)}Sb_{(1-x)}$ layer undergoes tensile strain, and the hydrogen passivation resistance decreases. Hydrogen passivation is practically negligible when the ratio of hydrogen-passivated carbon acceptors to all carbon acceptors existing in the carbon-doped $GaAs_{(x)}Sb_{(1-x)}$ layer is approximately 5% or less. The allowable range of this condition is $x\leq0.55$ as the composition of the $GaAs_{(x)}Sb_{(1-x)}$ layer. This condition is the upper limit of the composition of the $GaAs_{(x)}Sb_{(1-x)}$ layer in view of the hydrogen passivation resistance.

Viewpoint (iii) will now be explained below. First, within the range of $0\leq x<0.51$, $\Delta Ec$ (conduction band edge discontinuity) of $In_{(1-z)}Al_{(z)}P/GaAs_{(x)}Sb_{(1-x)}$ increases as x decreases because the potential of the conduction band of GiAsSb rises. In this case, z can be further increased. In this state, the interaction of the compression strain in the $GaAs_{(x)}Sb_{(1-x)}$ layer and the tensile strain in the $In_{(1-z)}Al_{(z)}P$ layer makes the critical film thickness smaller than that on the InP substrate, and increases the defect density at the collector/base interface. These are the lower limit of the composition of the $GaAs_{(x)}Sb_{(1-x)}$ layer and the upper limit of the composition of the $In_{(1-z)}Al_{(z)}P$ layer in view of the interaction of the strained layers, and $x\geq0.40$ and $z\leq0.35$.

Viewpoint (iv) will be explained below. To prevent deterioration of the device characteristics, the potential in the conduction and end of the collector layer must be held lower than that of the base layer. The differences between the potential of the conduction band of InP and those of $GaAs_{(x)}Sb_{(1-x)}$ and $In_{(1-z)}Al_{(z)}P$ can be estimated by the compositions x and z. Since $\Delta Ec$ of $GaAs_{(0.51)}Sb_{(0.49)}/InP$ is estimated to be about 0.18 eV, the condition under which the potential in the conduction band edge on the collector layer side is lower is $0.49x+1.554z\leq0.36$ on the basis of the compositions x and z. Since $0.40\leq x\leq0.55$ from (i) to (iii), a possible range of z is $0<z\leq0.18$.

Collectively, the problems of the boundary layer can be eliminated if the base layer is made of $GaAs_{(x)}Sb_{(1-x)}$, the interface on the collector layer side of the base layer is made of $In_{(1-z)}Al_{(z)}P$, the ranges of the compositions x and z are $0.40 \leq x \leq 0.55$ and $0 < z \leq 0.18$, respectively, and the relationship between x and z is $0.49x + 1.554z \leq 0.36$. As a method of reducing the influence of strain, it is also possible to apply a compositionally-graded layer in which the Al content of the $In_{(1-z)}Al_{(z)}P$ collector layer is decreased away from the base junction plane (base layer side) to make InAlP approach InP.

In the heterostructure bipolar transistor shown in FIG. 11 as described above, the composition of the base/collector interface steeply changes because the collector compositionally-graded layer 1104 is formed. Consequently, as shown in a band diagram of FIG. 13, the local drop in the conduction band edge near the base/collector interface is suppressed, so a state in which there is no obstacle to the transit of electrons can be realized.

Also, if a base layer made of GaAsSb is formed on a collector layer made of InP, the boundary layer described previously is formed at the interface. This may interfere with selective etching from the base layer to the collector layer when wet chemical etching for forming the structure as shown in FIG. 11 is performed. If the boundary layer exists at the base/collector interface, the etching behavior changes near the interface regardless of whether the etchant is for the base or collector, and this makes the designed structure difficult to realize.

By contrast, in the stacked structure of the collector layer 1103, collector compositionally-graded layer 1104, and base layer 1105, no boundary layer forms from the base layer 1105 to the collector compositionally-graded layer 1104 and collector layer 1103 when wet chemical etching for forming the structure as shown in FIG. 11 is performed, so selective etching can be smoothly performed.

INDUSTRIAL APPLICABILITY

The present invention described above can provide a heterostructure bipolar transistor capable of high-speed operation.

The invention claimed is:

1. A heterostructure bipolar transistor, comprising:
a substrate made of InP;
a collector layer formed on said substrate and made of a compound semiconductor containing indium and phosphorus;
a base layer formed on said collector layer and made of a p-type compound semiconductor containing gallium, arsenic, and antimony, said base layer containing carbon added as a dopant;
an emitter layer formed on said base layer and made of a n-type compound semiconductor containing indium, aluminum and phosphorus;
wherein at least one $GaAs_{(x)}Sb_{(1-x)}$ layer is used in said base layer and at least one $In_{(1-y)}Al_{(y)}P$ layer is used in said emitter layer, where x and y represent an As content and an Al content, respectively, in a mixed crystal composition;
wherein said As content x is in the range of $0.45 \leq x \leq 0.55$ and said Al content y is in the range of $0 < y \leq 0.25$, with x and y satisfying the formula $0.49x + 1.554y > 0.36$;
wherein a composition ratio of indium to aluminum in said emitter layer is in a range within which a potential energy in a conduction band edge of said emitter layer close to said base layer side is higher than that in a conduction band edge of said base layer.

2. A heterostructure bipolar transistor according to claim 1, characterized in that the composition ratio of Al in said emitter layer decreases away from said base layer.

3. A heterostructure bipolar transistor according to claim 1, characterized in that the composition ratio of As in said base layer decreases away from said emitter layer.

4. A heterostructure bipolar transistor according to claim 1, characterized in that said collector layer is made of a compound semiconductor containing indium, aluminum, and phosphorus.

5. A heterostructure bipolar transistor according to claim 4, characterized in that
said base layer is made of $GaAs_{(x)}Sb_{(1-x)}$,
said collector layer is made of $In_{(1-z)}Al_{(z)}P$, and
x and z represent mixed crystal compositions and fall within ranges of $0 < x < 1$ and $0 < z < 1$, respectively.

6. A heterostructure bipolar transistor according to claim 5, wherein:
said content z is in the range of $0 < z < 0.18$; and
said contents x and z satisfy a formula $0.49x + 1.554z \leq 0.36$.

7. A heterostructure bipolar transistor according to claim 4, characterized in that the composition ratio of Al in said collector layer decreases away from said base layer.

8. A heterostructure bipolar transistor according to claim 5, wherein:
layers including said base layer and emitter layer forming the heterostructure bipolar transistor are formed by metal organic chemical vapor deposition.

9. A heterostructure bipolar transistor according to claim 8, characterized in that said base layer is formed at a growth temperature of not less than 480° C.

* * * * *

UNITED STATES PATENT AND TRADEMARK OFFICE
CERTIFICATE OF CORRECTION

PATENT NO. : 7,242,038 B2  Page 1 of 1
APPLICATION NO. : 10/560756
DATED : July 10, 2007
INVENTOR(S) : Oda et al.

It is certified that error appears in the above-identified patent and that said Letters Patent is hereby corrected as shown below:

On the title page item (54) and col. 1, line 1, delete "HETEROJUNCTION" and insert -- HETEROSTRUCTURE --.

Signed and Sealed this

Twenty-ninth Day of April, 2008

JON W. DUDAS
*Director of the United States Patent and Trademark Office*